United States Patent [19]
South et al.

[11] Patent Number: 4,771,396
[45] Date of Patent: Sep. 13, 1988

[54] DIGITAL FILTERS

[75] Inventors: Colin R. South; Alwyn V. Lewis, both of Suffolk, England

[73] Assignee: British Telecommunications PLC, London, England

[21] Appl. No.: 711,686

[22] Filed: Mar. 14, 1985

[30] Foreign Application Priority Data

Mar. 16, 1984 [GB] United Kingdom ................ 8406846

[51] Int. Cl.$^4$ .............................................. G06F 7/38
[52] U.S. Cl. ........................... 364/724.16; 364/724.19
[58] Field of Search ........................................ 364/724

[56] References Cited

U.S. PATENT DOCUMENTS

| | | | |
|---|---|---|---|
| 4,349,889 | 9/1982 | van den Elzen et al. | 364/724 |
| 4,425,483 | 4/1984 | Lee et al. | 379/411 |
| 4,550,415 | 10/1985 | Debus, Jr. et al. | 364/724 |
| 4,571,732 | 2/1986 | Pirani et al. | 364/724 |
| 4,580,275 | 4/1986 | Pirani et al. | 364/724 |
| 4,594,725 | 6/1986 | Desperben et al. | 364/724 |

OTHER PUBLICATIONS

B. Widrow, "Adaptive Filters" in Aspects of Network and System Theory", edited by R. E. Kalman and N. De Claris pub. Holt, Rinehart and Wilson, ISBN 03-0772200-6; Relevant as General background on the subject of Adaptive Filters.
K. Ochia, T. Araseki and T. Ogihara, "Echo Canceller with Two Echo Path Models," IEEE Transactions on Communications, vol. 25, No. 6, pp. 589-595, Jun. 1977, describes a two echo path modem.
B. V. Rao and T. Murali, "A New Design for Digital Adaptive Filters", Int. J. Electronics, vol. 55, No. 3, pp. 473–477, 1983; discusses the problems of limit cycling.
K. Takahashi, T. Sakamoto and I. Tokizawa, "A Cas-cadable Echo Canceller" Int. Conf. Commun., 1982 Jun. 13-17, Philadelphia, (IEEE).
I.E.E. Proceedings, vol. 130, No. 2, sections A a I, part E. Mar. 1983, pp. 42-45, Old Working, Surrey, GB: J. O. Normile et al.: "Adaptive Filtering with Finite Wordlength constraints".
IEEE Transactions on Acoustics, Speech and Signal Processing, vol. ASSP-31, No. 3, Jun. 1983, pp. 541-549, New York, U.S.: C. F. N. Cowan et al.: "A Digital Adaptive Filter Using a Memory-Accumulator Architecture: Theory and Realization".
ICASSP 84 Proceedings, vol. 1, Mar. 19-21, 1984, San Diego, Calif., U.S., pp. 3.4.1-3.4.4, IEEE; C. R. South et al.; "Extension Facilities and Performance of an LSI Adaptive Filter".

*Primary Examiner*—Gary V. Harkcom
*Assistant Examiner*—Dale M. Shaw
*Attorney, Agent, or Firm*—Nixon & Vanderhye

[57] ABSTRACT

A transversal finite impulse response, adaptive digital filter comprises three stages (10, 11, 12). The stage (10) is a memory stage which stores input samples x and coefficients. The second stage (11) is an arithmetic stage which forms convolution products and accumulates the product to provide an output. The third stage (12) forms update values for updating the coefficients according to a predetermined algorithm. The stages are coupled by buses (14, 15) and data transfer between the stages via the buses is controlled by a control unit (18). The filter operates so that convolution products are formed during a first part of each sample period and update values are formed during a second part of each sample period for use in the subsequent sample period.

17 Claims, 10 Drawing Sheets

Process cycle No.
Fundamental clock No. indicates α phase 243 244 245 246 247 248 249 250 251

CS

PL1

PL2

DSTBR

AWSTBX

DSTBX

PX 1-3

LKMASK 252 253 254 255 0 1 2 3 4 5 6 7

Fig.6(c)

DIGITAL FILTERS

This invention relates to digital filters. Digital filters are devices which receive digital input samples, operate on the samples by multiplying them by filter coefficients to form convolution products and accumulate the products to produce an output. The filter coefficients are selected to produce a desired impulse response.

In applications where the filter is used to model a path, eg an audio path, it can be made adaptive. In this case the output signal of the filter is compared with a desired signal to produce an error signal and the error signal is used to adjust the filter coefficients so that the error signal tends to zero.

A problem, particularly for digital filters designed to operate in the audio band, is the implementation of an economic filter in Large Scale Integrated circuits (LSI). One aspect of the present invention concerns an adaptive digital filter which can be implemented economically in LSI.

Another problem which occurs in conventional adaptive digital filters is what is known as a limit cycle. In an audio application the filter receives audio samples at intervals referred to as audio cycles. During each audio cycle there are a plurality of process cycles during each of which a convolution product is formed. In conventional filters all the process cycles which make up an audio cycle are used to form convolution products, the error signal derived from that audio cycle not being formed until the next audio cycle so that the updated filter coefficients are not available until the subsequent audio cycle ie two cycle delay. This delay is known as limit cycling and affects the speed of operation of the device.

According to one aspect of the present invention there is provided an adaptive digital filter comprising a memory stage for storing input samples and filter coefficients, an arithmetic stage for forming convolution products of said input samples and said coefficients and accumulating said products to provide an output signal, a third stage arranged to form an update signal for adapting said filter coefficients according to a predetermined algorithm, bus means coupling said stages to permit data transfer therebetween, and control means for providing timing signals to control operation of said stages and transfer of data between said stages.

It has been found that a digital filter of this architecture, and designed to operate in the audio band, can be implemented satisfactorily in LSI.

According to another aspect of the present invention there is provided an adaptive digital filter of the type which receives input samples x, forms during each sample period, a plurality of convolution products which are accumulated to produce an output signal, and adjusts the filter coefficients according to a predetermined algorithm wherein said convolution products are formed during a first part of each sample period and said filter coefficient adjustment is performed during a second part of each sample period which is subsequent to said first part.

A filter of this form is a significant improvement over the conventional arrangement discussed above since its speed of adaptation is considerably increased. There may be a slight loss of precision due to the fact that fewer convolution products can be formed during each sample period but this is more than outweighed by the gain in the rate of adaptation.

According to a further aspect of the present invention there is provided an adaptive digital filter of the type which receives input samples x, forms during each sample period a plurality of convolution products which are accumulated to produce an output signal, and adjusts the filter coefficients according to a predetermined algorithm wherein said filter includes means for forming during each sample period value of $x^2$ which are used in forming an update value for said filter coefficients according to said algorithm.

According to a still further aspect of the present invention there is provided a method of operating an adaptive digital filter of the type which receives input samples x, forming during each sample period a plurality of convolution products which are accumulated to produce an output signal, and adjusting the filter coefficients according to a predetermined algorithm, the method comprising the steps of forming convolution products during a first part of each sample period, and calculating adjustment values of the filter coefficients during a second part of each sample period which is subsequent to said first part.

The invention will be described now by way of example only with particular reference to the accompanying drawings. In the drawings:

FIGS. 6a–6c are a timing diagram showing waveforms at various parts of the circuit;

Figure 1:
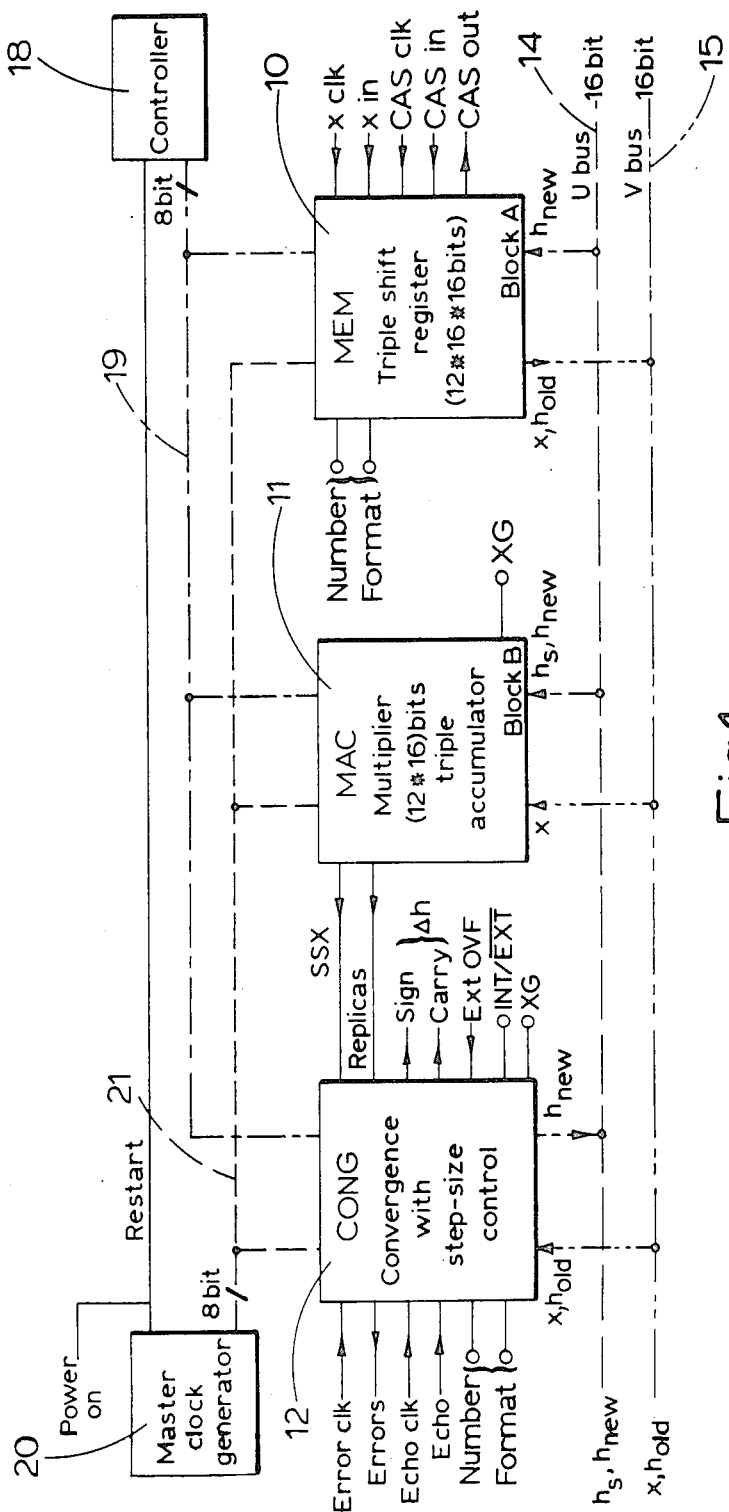
FIG. 1 is a block schematic diagram of an adaptive digital filter in accordance with the present invention.

Referring to FIG. 1 an audio band adaptive, finite impulse response digital filter which can be implemented in LSI can be considered as comprising three functional blocks 10, 11 and 12 which are interconnected by two 16 bit data buses 14, 15. The block 10 is a memory block which can store 12-bit samples of an audio band input signal x which is to be filtered together with a plurality of filter coefficients h, stored to 16 bit precision, which are to be multiplied with the input samples to form the convolution products. Two sets of filter coefficients are stored, one being known as the adapt coefficients which can adapted during each audio cycle and the other being known as a store version which is not adapted. The memory block 10 comprises three circulating shift registers, one for storing the twelve-bit x samples, a second for storing the adapt coefficients and the third for storing the store coefficients.

The block 11 is a multiplication and accumulation block in which the products of the samples x and the filter coefficients are formed and then accumulated to form the required or replica signal which is output to the block 12. The convolution products for the adapt coefficients are formed and accumulated separately from those for the store coefficients. The two sets of accumulated values are used to produce the replica signal. In addition in the block 11 a quantity known as the sum of the squares of x (SSX) is formed and the significance of this will become apparent later.

The block 12 is a convergence device which inter alia calculates update values for updating the filter adapt coefficients stored in the block 10 according to a predetermined algorithm.

The blocks 10, 11, 12 are controlled from a controller 18 via an eight bit control bus 19 and clock pulses are provided from a master clock generator 20 which feeds clock waveforms onto an eight bit bus 21.

A feature of the present filter is the way in which the convolution products, the replica signal and the update values are evaluated. A conventional filter operates in cycles which in a telephone application will be audio cycles. A typical audio cycle will comprise 256 process cycles. In such conventional filters all 256 process cycles are used in the formation of convolution products and these products are not used in the formation of the error signal until the next audio cycle such that the calculated error signal and hence the updated filter coefficients are not available until the following audio cycle which is thus two cycles later. This leads to a delay which is known as limit cycling. The introduction of a limit cycle has a number of consequences. A minor consequence is the need for an additional storage element which is required to hold certain values but more importantly is the reduction in the rate of adaptation of the filter.

Figure 7:
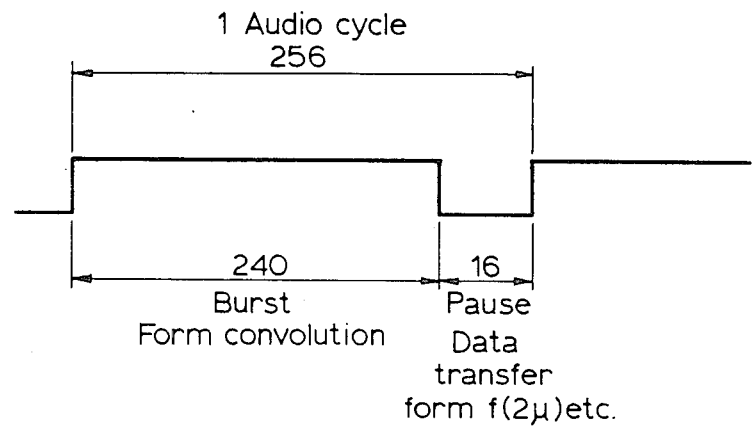
FIG. 7 is another waveform diagram illustrating the operation of the filter.

In the present filter each audio cycle is considered as comprising two parts or periods one of which is called the burst period and the other of which is called the pause period (see FIG. 7). During the burst period the convolution products are formed and during the pause period the replica signal is computed together with the error and update signals. Thus the updated coefficient values are available for the next audio cycle. It will be noted that the number of process cycles available for convolution products is reduced and hence the number of coefficients which can be used is also reduced compared with a conventional filter. However, this is considered to be a minor point which compared with the speeding up of the rate of adaptation which is obtained by dividing each audio cycle as described above. In fact, a much more accurate filter is realised.

In theory the minimum number of cycles required to implement a pause is three process cycles although in practice in order to allow sufficient time to accommodate data transfer from the multiplication block 11 to the convergence block 12 a typical pause will comprise sixteen process cycles. Therefore, in the case of a sample period of 256 process cycles this leaves 240 process cycles for forming the convolution products.

The filter described with reference to FIG. 1 effectively comprises two filters, one of which makes use of the adapt coefficients and the other which makes use of the store coefficients. In operation the two sets of coefficients and the samples x are multiplexed onto the buses 14, 15 and into the block 11 so that the convolution products of two separate impulse responses with the samples x can be formed and accumulated. The coefficients in one store can be transferred to the other and vice versa.

The particular architecture shown in FIG. 1 provides flexibility enabling the filter to be just a single filter or the two filter version just referred to. In addition filters can be cascaded as will be described later.

Figure 2:
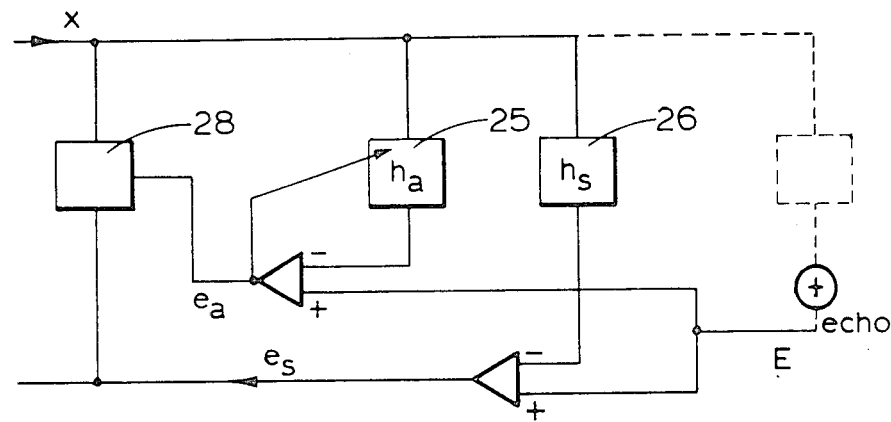
FIG. 2 is a schematic diagram showing one application of the present filter.

The type of structure described with reference to FIG. 1 has particular application in a loudspeaking telephone. Such an application is shown schematically in FIG. 2. In this arrangement, digital samples x of an audio signal x (the loudspeaker signal) are fed through filters 25, 26 which have adapt and store coefficients respectively. The filters are arranged to model a path h through which the audio signal are transmitted and to produce a signal for cancelling the "echo" E from the microphone. The filter 26 is a normal transversal filter which is located in the transmission path (or foreground) and the coefficients for this filter are obtained by transfer from the adapt (or background) filter 25.

Coefficient transfer from the background filter 25 to the foreground filter 26 takes place under the control of a microprocessor 28 when a comparison of the error output from each filter indicates that the background filter has a better performance than the foreground. This arrangement can track a changing impulse response rapidly by means of the adaptive filter but allows performance measurement before the previous estimate of impulse response is deleted.

The following theoretical analysis will enable those skilled in the art to appreciate the manner in which the present filter functions. The convolution products are formed and accumulated in accordance with the well know relationship $$y = \sum_{n=1}^{N} x_n h_n$$

where y is the output signal and the coefficients h are selected to provide the required filter impulse response.

The update values are based on a distributed normalisation architecture which uses a least mean squares algorithm. In this analysis the following symbols are used:

D vector of misadjustment noise d
$\Delta h$ update component
$\Delta H$ vector of update component
e error
g scaler for filter output
h coefficient of impulse response which is to be modelled by the filter
H vector of h
h* estimate of impulse response coefficient—ie the coefficient actually used in the filter
H* vector of h*
k additional scaler for filter output
n noise
N vector of n
$n_a$ quantisation noise from A/D or D/A conversion
$n_r$ quantisation noise from truncation of filter output
$n_f$ quantisation noise from finite precision in convolution
$n_n$ quantisation noise from truncation of $\Delta h$ bus
$n_b$ quantisation noise from truncation of $2\mu e$ bus
$\sigma$ standard deviation
$t_1$ scaler for normalisation of $2\mu e$ bus
$t_2$ scaler for normalisation of $\Delta h$ bus
$\mu$ scaler for update term $\Delta h$
w number of coefficients in impulse response
x input signal
C reciprocal of the number of cascade stages
q scaler for $\Delta h$ ("stepsize scaler")
y output signal from reference channel
r replica signal It should be noted here that the scale factors q, k, $t_1, t_2$ are necessary for normalisation of the various quantities at appropriate points in the device.

Using the LMS algorithm it is assumed that data values are taken from an infinitely precise field and loss of precision is modelled by addition of quantisation noise. Assuming arithmetic is fixed binary point then the effect of non-linearity can be examined by approximations to the linear system. Normalisation of the product $z = x\,y$ is modelled as division by bit shifting then truncation, plus a quantisation noise.

$$Z = \frac{xy}{t} + n \qquad (1)$$

Figure 3:
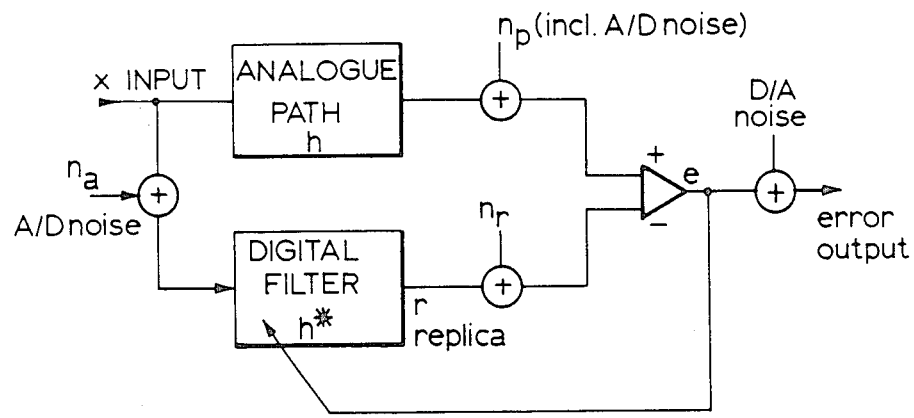
FIG. 3 is a schematic diagram illustrating the operation of the present filter.

In FIG. 3 'x' is an analogue input by definition of infinite precision. Assuming that the reference channel impulse response is bounded by the product of sample period T and number of coefficients W, the error, in vector notation, at sample 'j' using Equation (1) is:

$$e_j = \frac{1}{g} X_j^T + np - \frac{1}{g \cdot k}(X_j + N_{aj})^T(H^*_j + N_{tj}) - n_{tj} \qquad (2)$$

where $X_j$ is the vector of x at time instant j (containing terms $(x_j, x_{j-1} \ldots x_{j-W-1})$).

NB: 'np' is the noise present in the desired" signal to be modelled.

'k' is a scaler which provides improved precision with knowledge of the response amplitude.

$N_{t,j}$ sets the precision of H* in the convolution. Following the method of steepest descent to find H* for minimum $e^2$.

$$H^*_{j+1} = H^*_j + 2 \cdot \mu \cdot e_j \nabla_{j^*}(e_j) \qquad (3)$$

Differentiating Equation (2) w.r.t. H* and substituting into Equation (3).

$$H^*_{j+1} = H^*_j - \left[\frac{2 \cdot \mu}{g \cdot k}\right] \cdot e_j \cdot (X_j + N_{aj}) \qquad (4)$$

The second term in equation (4) represents the update value for updating the filter coefficients at the end of an audio cycle.

The update vector requires two multiplications, applying Equation (1) and substituting for the misadjustment vector:

$$D = H - \frac{H^*}{k} \qquad (5)$$

Then $$D_{j+1} = \qquad (6)$$

$$D_j + \frac{1}{k}\left[\left[\frac{2 \cdot \mu \cdot e_j}{g \cdot k} \cdot \frac{1}{t_1} + n_{bj}\right][X_j + N_{aj}] \cdot \frac{1}{t_2} + N_{hj}\right]$$

Form the square of the Euclidean vector length:

$$\|D_{j+1}\|^2 = \|D_j\|^2 + \left[\frac{2 \cdot \mu}{g \cdot k \cdot k \cdot t_1 \cdot t_2}\right]^2 \cdot \qquad (7)$$

$$\left[e_j + \frac{g \cdot k}{2\mu} \cdot t_1 \cdot n_{bj}\right]^2 * \|X_j + N_{aj}\|^2 +$$

$$\frac{\|N_{hj}\|^2}{k} + \frac{4\mu}{g \cdot k \cdot k \cdot t_1 \cdot t_2} \cdot \left[e_j + \frac{g \cdot k}{2\mu} \cdot t_1 \cdot n_{bj}\right] *$$

$$D_j^T(X_j + N_{aj}) + 2 \cdot D_j^T \cdot N_{hj} +$$

$$\left[\frac{2 \cdot \mu}{g \cdot k \cdot k \cdot t_1 \cdot t_2} \cdot \left[e_j + \frac{g \cdot k}{2\mu} \cdot t_1 \cdot n_{bj}\right]\right](X_j + N_{aj})^T \frac{N_{hj}}{k}$$

Take expectations and assume that the noise contributions are independent random deviates with zero mean and variance $\sigma^2$.

i.e. $E(n) = 0$, $E(n_b^2) = \sigma_b^2$,
$E(d^2) = \sigma_d^2 E(\|N_a\|^2) = W \cdot \sigma_a^2$ etc. (8)

Where $$d = \frac{1}{g} X^T D$$

the misadjustment noise.

All noise components with the exception of 'd' found from the expansion of Equation (2) are included in 'np'. The term $E(\|x\|^2)$ will be retained since for speech-like signals an estimate the power of the input signal is difficult.

The equation (7) reduces to:

$$E(\|D_{j+1}\|^2) = E(\|D_j\|^2) + \qquad (9)$$

$$\left[\frac{2\mu}{g \cdot k \cdot k \cdot t_1 \cdot t_2}\right]^2 \cdot$$

$$\left[\sigma_d^2 + \sigma_p^2 + \sigma_r^2 + \left[\frac{g \cdot k \cdot t_1}{2\mu}\right]^2 \cdot \sigma_b^2\right] *$$

$$(E\|X\|^2 + W \cdot \sigma_h^2) + \frac{4\mu \cdot \sigma_d^2}{k^2 \cdot t_1 \cdot t_2}$$

For convergence it is seen from Equation (9) that $$E(\|D_j\|^2) < E(\|D_{j+1}\|^2) \qquad (10)$$

therefore the right hand terms in Equation (9) must be less than zero. This function is quadratic in $(2 \cdot \mu/g \cdot k)$ where the negative region lies between its roots. A good approximation for stability is given by:

$$0 < f\left(\frac{2 \cdot \mu}{g \cdot k}\right) < - \qquad (11)$$

$$\frac{2 \cdot g \cdot t_1 \cdot t_2}{E\|X\|^2 \cdot \gamma \cdot \left(1 + \frac{1}{\sigma_d^2}(\sigma_p^2 + \sigma_r^2)\right)}$$

where $f[2\mu/g \cdot k]$ (referred to for convenience as $f(2\mu)$) is an approximation to the combined scale factor $2\mu/g \cdot k$ where $$\gamma = \left(1 + W \cdot \sigma_a^2 \cdot \frac{1}{E\|X\|^2}\right)$$

As time tends to infinity it is expected that:

$$E(\|D_j\|^2) = E(\|D_{j+1}\|^2) \tag{12}$$

Substituting into Equation (9) for the misadjustment noise $$\sigma_d^2 = \tag{13}$$

$$-\frac{\left[\sigma_n^2 + \dfrac{\sigma_b^2 \cdot t_1^2}{f\left[\dfrac{2\cdot\mu}{g\cdot k}\right]^2} + \dfrac{W\cdot t_1^2 \cdot t_2^2 \cdot \sigma_h^2}{f\left[\dfrac{2\cdot\mu}{g\cdot k}\right]^2 \cdot E\|X\|^2 \cdot \gamma}\right]}{\left[1 + \dfrac{2\cdot g\cdot t_1 \cdot t_2}{f\left[\dfrac{2\cdot\mu}{g\cdot k}\right] \cdot E\|X\|^2 \cdot \gamma}\right]}$$

where $\sigma_n^2 = \sigma_p^2 + \sigma_r^2$

The filter is designed to operate according to above analysis.

The LSI uses fixed point arithmetic, except for $f(2\mu)$. 'g' is specified by the dynamic range of the A-D conversion and expected reference path gain. Using 12 bit conversion and a lossless path $g=2^{11}$. To determine the maximum step-size, it is seen from Equation (13) that the minimum misadjustment occurs when the noise contributions from bus truncation tend to zero.

$$f\left[\frac{2\cdot\mu}{g\cdot k}\right]_{opt} \sim \frac{-g\cdot k \cdot t_1 \cdot t_2}{E\|X\|^2} \tag{14}$$

Estimating speech signal power requires a pessimistic value to ensure stability but the instantaneous value of $\|x\|^2$ (SSX) may be simply calculated. The maximum $t_1 \cdot t_2$ value is dependent on the minimum peak to mean ratio of 'x' and the number of coefficients. To handle full-scale sine waves when Equation (14) is unity then:

$$t_1 \cdot t_2 = \frac{W \cdot g}{2 \cdot k} \tag{15}$$

For a single filter module with $W \sim 2^8$, $g=2^{11}$ and $k=1$, Equation (15) equals $2^{18}$ which must be distributed between the normalisation of each multiplication.

Implementing division in Equation (14) by bit shifting is non-linear and since SSX is formed by each filter unit, allowance must be made in the product $t_1 \cdot t_2$ for cascading. Reduction of the step-size improves adaptation on noisy channels, thus two variables are introduced 'c' for cascading and 'q' to reduce the step-size, where $0 < (c$ and $g) < 1$. Equation (14) becomes:

$$f\left[\frac{2\cdot\mu}{g\cdot k}\right] = \frac{g\cdot k\cdot t_1\cdot c\cdot q\cdot t_2}{2^{trunc(log_2\|X\|^2)}} \tag{16}$$

Equation (13) shows that $t_1 = 2^0$ gives minimum adjustment noise. This has a penalty in speed of adaptation, since all data buses must be protected against overflow. By measurement it was found that values near $t_1 = 2^6$, $t_2 = 2^{12}$ give a good compromise between speed of adaptation and performance over the compensated range.

As has been described above with reference to FIG. 1 the filter unit is partitioned into three functional blocks connected to a thirty-two bit data bus, an eight bit control bus plus serial I/O and clock lines. The memory 10 consists of three circulating shift-registers, one contains the twelve bit X vector, the other two hold H* 'adapt' and 'store' to sixteen bits. This finite precision is limited by the external bus size (which may be extended) and determines the quantisation noise of $\sigma_h^2$. The choise of shift-register storage reduces the problem of data read/write to one of generating suitable clock strobes. Transfer of data between H stores is signalled on the control bus as 'update' or 'download' to direct data between shift-registers within a period T. To load an arbitary impulse response into the 'stored' filter requires an external circuit which writes to the 'adapt' filter, and downloads the response into the 'stored' filter.

In the multiply n- accumulate device 11 both convolutions and SSX are multiplexed into a single 12 by 16 bit Modified Booth's Algorithm multiplier which has a delay of six process cycles, requiring time skew of bus data. The SSX is calculated and output using:

$$SSX_{j+1} = SSX_j - x_{j-239}^2 + x_{j+1}^2 \tag{17}$$

A number of functions are performed in the convergence device dependent on the control bus word, which is read every period T. The control bus provides the following facilities: cascade depth, speed of adaptation 'q', update, download, zero, freeze the 'adapt' filter and output the H* overflow status. $f(2\mu)$ is calculated from SSX (Equation (16)) and the error is the desired signal (y) minus the replica. These values are input to a 12 by 12 bit ripple-through multiplier and the output is then scaled by 'k' with a barrel shifter and latched back into one multiplier input port during the 'pause'. It should be noted that the internal arithmetic is two's complement which requires rounding to remove d.c. offset after truncation.

The bus data skew enables the coefficient update term $\Delta h = f(2\mu) \cdot e \cdot x$ to be formed during the 'burst' in the multiplier, scaled in a barrel 62 shifter by c.q and added to the correct value of h* before its use in the convolution. Division of $\Delta h$ by 'Q shifting' is implemented as:

$$q = 2^q (q = 0, -1, \ldots -M) \tag{18}$$

Provision may be made to select any of the common binary formats for the serial data I/O.

A more detailed explanation of how this is achieved will now be given.

Figure 4:
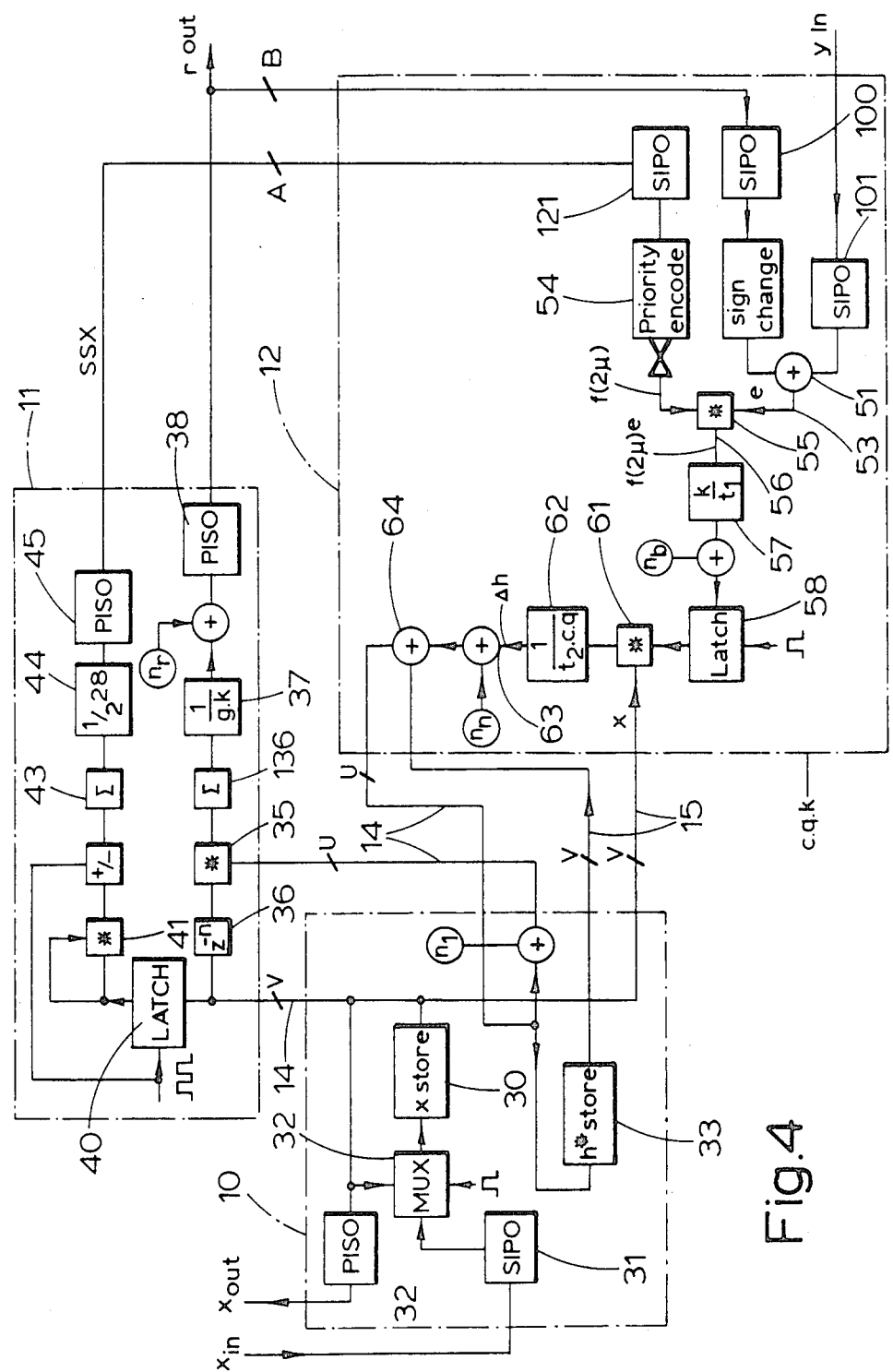
FIG. 4 is a block diagram showing in more detail the filter of FIG. 1.

Referring now to FIG. 4 of the drawings the block 10 is shown as comprising an X store 30 which can receive input signals x via a SIPO 31 and a multiplexer 32. The block also includes a H store 33 for storing the filter coefficients. The x values and the h* values are clocked out from the respective stores onto the buses 14 and 15 and fed to the block 11. The block 11 includes a multiplier 35 which receives the x values via a delay element 36 and the H values via the bus 14. The multiplier 35 forms the convolution products which are summed in an accumulator 136. As will be seen later, the accumulator 136 actually contains two summing circuits, for the forground and background filters respectively though the multiplier 35(41) is multiplexed. The output of the summing circuit 36 is applied to a circuit 37 which shifts the signals according to the values g and k. The values are fed into respective parallel input serial output circuits 38, the outputs of which constitute the required replica signals r. This signal is fed to the block 12. The block 11 also includes a latch 40 which feeds x values to a circuit 41 which forms values of $x^2$. These are accumulated in an accumulator 43, scaled in a circuit 44, and fed into a PISO 45. The output of the PISO 45 is the required signal SSX which is fed to the block 12 for the convergence calculation. The block 12 receives the desired signal y which is fed via an SIPO 101 to a summation circuit 51 where it is combined with the negative of the replica signal r to form the error signal on line 53. The error signal e is applied to a multiplier 55 which combines the signal e with the signal $f(2\mu)$ derived from the SSX signal by means of an encoder 54 (as described in more detail below) to form the product $f(2\mu)e$ on line 56. This is scaled by a barrel shifter 57 and applied to a latch 58. The output from the latch 58 is multiplied in a multiplier 61 by the x value on bus 15 to form a value $f(2\mu)\cdot e\cdot x\cdot k/t_1$. The output from the multiplier 61 is applied to a barrel shifter 62 to probide the update signal $\Delta h$ on line 63 which is summed in an adder 64 to provide the updated value of the coefficient which is then fed into the store 33.

The operation of the filter will be described now in more detail by considering the sequence of data flow for an input signal $x_n$. The signal $x_n$ will be followed from its acquisition by the filter through one audio cycle in a convolution where it will contribute to an error signal and finally be used to update the correct impulse response coefficient in the same cycle.

Consider an input signal $x_n$ which has been obtained from the external environment together with a desired (or echo) signal $y_n$ at time interval n. These signals are applied serially to the filter the x input being fed to the memory block 10 and the y input to the convergence block 12. The x input is clocked into the SIPO 31 prior to process cycle 253 (see FIG. 6—line 1) where it overwrites the oldest value of x which is stored in the rotating shift register, that is $x_{n-257}$. Simultaneously the new value of x appears on the bus 15 during the high part of strobe $\Omega 23$ in process cycle 253 (see waveform 7 in FIG. 6). Execution of convolution with $x_n$ now takes place in the (n+1)th audio cycle so that one audio cycle delay is introduced.

$x_n$ now forms part of the first element in the two convolutions of audio cycle n+1 where it is multiplied by $h_s^0$ and $h_a^0$ respectively which occur on the bus 14 during process cycle zero. This multiplication is carried out in block 35. To begin the formation of updating SSX, the three process cycle delay of $h_s$ from the x value enables $x_n$ to be extracted early, ie bypassing the built in delay on the convolution (mulitplier-accumulator 35,136) device and applied to both sides of a multiplier 41 (in practice, a single multiplier may be used to carry out the functions of multipliers 41 and 35) to form $x_n^2$ at the output which is then added to the SSX accumulator 43 to form part of equation 17.

Figure 6A:
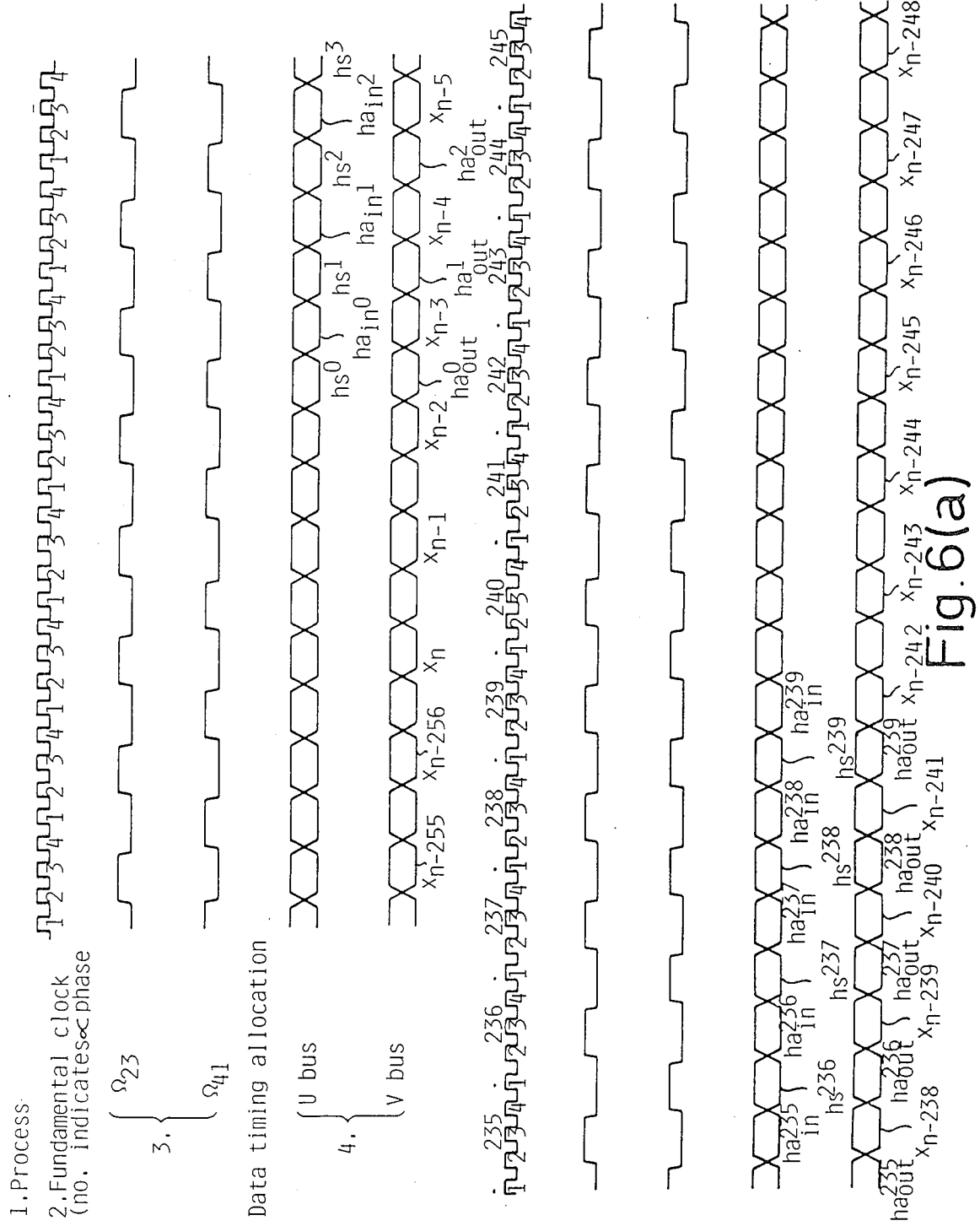
Figure 6B:
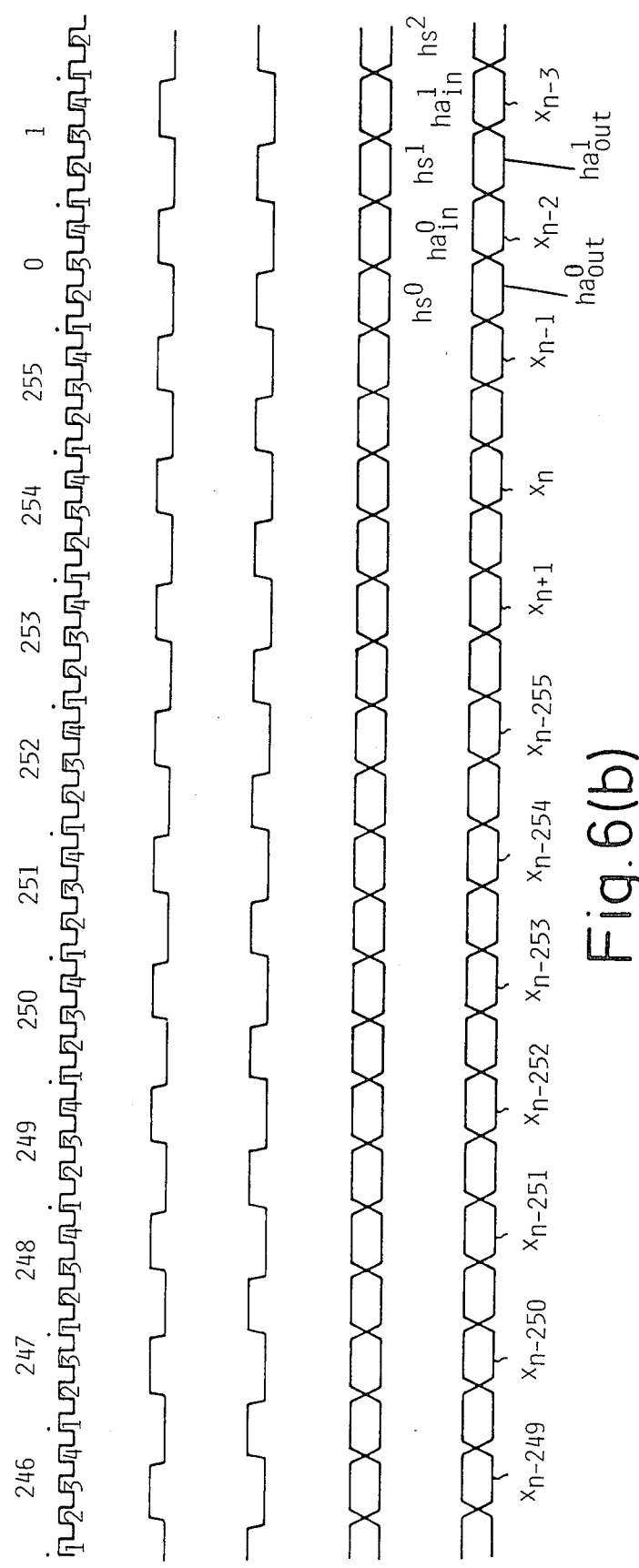

Convolution proceeds with the multiplication by block 35 of each past value of x from store 30 with $h_s$ and $h_a$ from the store 33, the product being fed into respective accumulators 36, until the value $x_n-239$ is multiplied by both $h_s 239$ and $h_a 239$ in process cycle 238 (see line 8 in FIG. 6). On completion of the 240th accumulation the outputs of the adapt and stored accumulators 36 are the computed replicas and these are loaded into the twelve bit PISO's 38 by selecting bits 11 to 22 which is effectively dividing by g (or bits 12 to 23 in the case of g·k) and truncating the values to twelve bits thus introducing the noise component shown as $n_r$ in FIG. 2 (see Equation 2). The output of the PISO is the adapt replica signal which is transmitted serially to the convergence device 12 during process cycles 243 to 250 when the strobe DSTBR (see waveform 10 on FIG. 6) is high followed by the stored replica when the next DSTBR is high during process cycles 253 to process cycle 5 of the next audio cycle.

$x_{n-240}$ appears on the bus 15 in process cycle number 237 (see waveform 8 FIG. 6) and is multiplexed onto both inputs of the multiplier 41 to form its square. The product appears at the output after $\alpha_2$ of process cycle 243 (see waveform 2 in FIG. 6) and is subtracted from the SSX accumulator to complete Equation 17. Twelve bits of the contents of SSX accumulator are loaded into the PISO 45 and transferred serially to the convergence device 12 during process cycles 243 to 249.

Figure 5A:
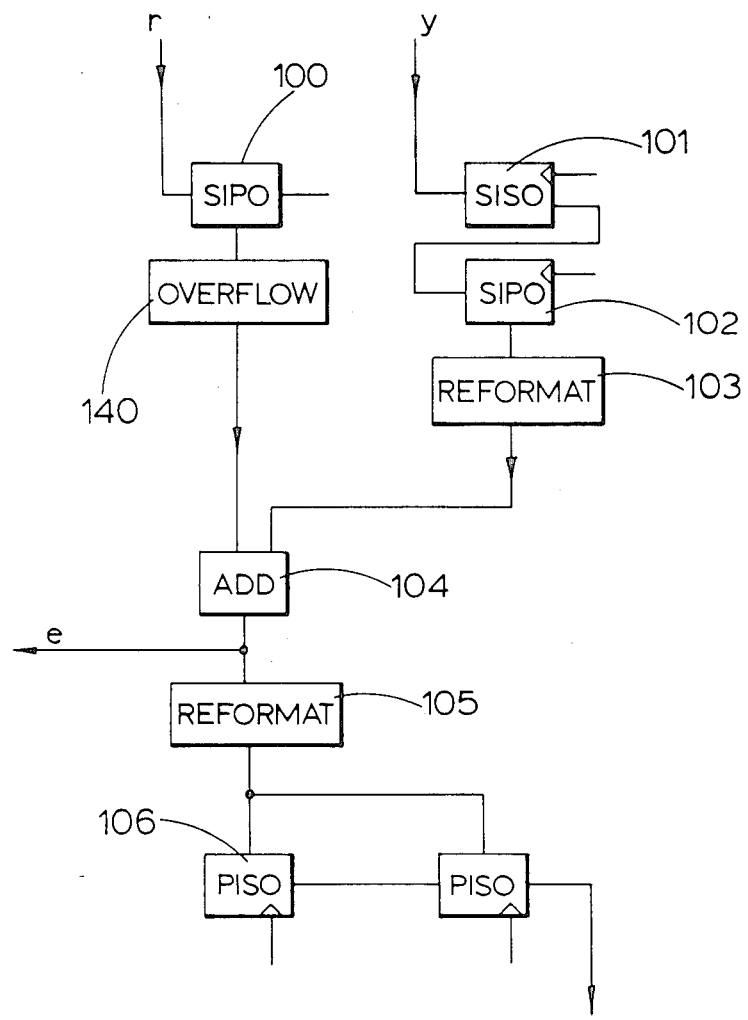
FIGS. 5a and 5b are a block schematic diagram showing in detail part of the filter shown in FIG. 1.
Figure 5B:
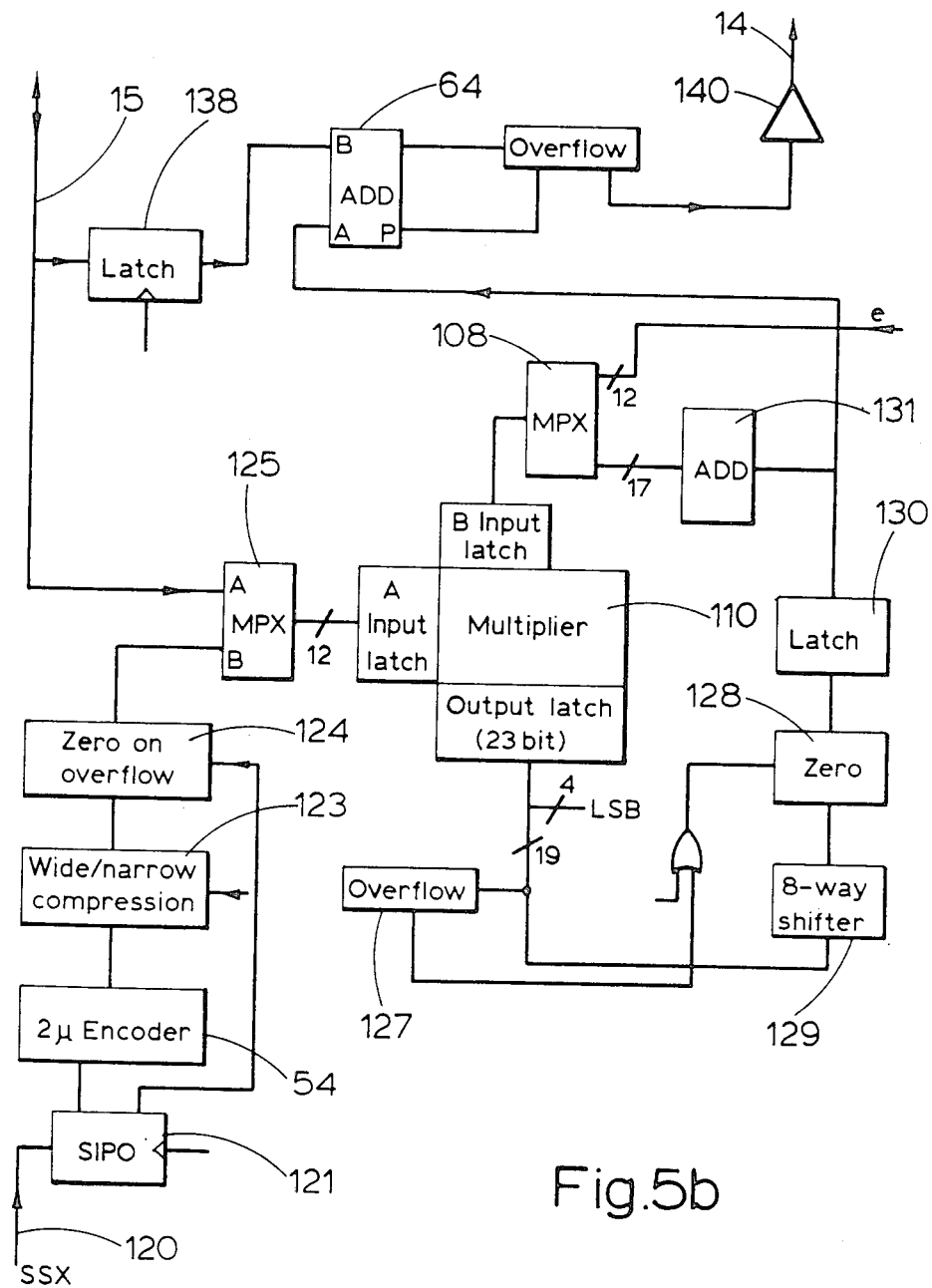

The operation of the converegence block 12 will be described now with particular reference to FIG. 5 which shows in more detail the functional blocks of block 12 in FIG. 4. The adapt replica signal is fed into SIPO 100. A pulse CB is used in process cycle 251 to 252 to latch data from the control bus 19 in FIG. 1 which data may be used to change for example the Q setting, zero the H adapt vector etc referred to above.

At some time prior to process cycle 251 a new desired echo signal $y_{n+1}$ was entered into a SIPO 101 which shifted the signal $y_n$ into a second SIPO 102. Thus the one audio cycle delay in sampling the external signals is accounted for. The number format of the $y_n$ signal in SIPO 102 is changed to two's complement by a converter 103 and then applied to the B input of an adder 104. The A input of the adder 104 receives the replica signal which has been overflow checked and complemented (140) together with setting the carry in of the adder to one implementing a sign change. The output of the adder 104 is the error signal e which is fed into two directions. In one direction the number is reformatted in a block 105 and output to a PISO 106 being latched on a pulse PL1 in process cycle 252 to 253. This allows the error signal to be output to the external environment. The other path for the error signal is via the A input of multiplexer 108 which is clocked on pulse MPX 1+3 (see waveform 14 in FIG. 6) onto the B input of a multiplier 110. It should be noted that the important strobe pulse is $\alpha_3$ in process cycle 252 which is applied to the B input latch of the multiplier 1109 and the P output latch of the multiplier.

Next consider the SSX input 120 which receives the SSX signals serially from the block 11 with the most significant bit in the first position. These values are fed into a SIPO 121 and then into an encoder 122 which forms the value $f(2\mu)$ according to Equation 16. From the block 122 the signal is fed to a block 123 which is used to restrict the compensation region to the upper eight bits thereby giving an effective q shift to lower signal levels and providing enhancement for noisy y signals. Overflow correction is provided by a block 124 and after this block the $f(2\mu)$ signal is fed to the A input of the multiplier 110 via the B input of a multiplexer 125 which is clocked on pulse MPX 1+3 (see waveform diagram 5). Units 122 to 124 represent the encoder 54 of FIG. 4.

The A and B input latches of the multiplier thus contain f $(2\mu)$ and the error signal e respectively during the period $\alpha_3$ in process cycle 252, and the product formed by the multiplier 110 is latched out via the P latch on pulse $\alpha_3$ in process cycle 253. A first stage of normalisation is then implemented by selecting certain bits of the $f(2\mu)$e product which corresponds to dividing by $t_1$ and truncating (corresponding to block 57 in FIG. 4), the latter introducing a noise component $n_b$ (see Equation 6). The result is overflow checked (127, 128) and corrected by setting $f(2\mu)\cdot e$ to zero. The signal $f(2\mu)\cdot e$ is then fed through an eight way barrel shifter 129 which has been set by decoding the presence, or not, of the factor K from the control bus. The product is latched into a latch 130 on the pulse $\alpha_1$ in process cycle 254. The upper 13 bits are checked for overflow, rounded, by adding the least significant bit to the data value in an adder 131 and then applied to the B input of the multiplier 110 via the B input of the multiplexer 108. It should be noted that the strobe MPX 1+3 goes low on the rising edge of the $\alpha_4$ in the process cycle 253 thus selecting the B input of multiplexer 108 but the B input of the multiplexer latches on $\alpha_3$ in the strobe BCLK MASK (see waveform 15 of FIG. 6) which is the strobe MPX 1+3 delayed by one process cycle. Consequently, f $(2\mu)$e is the last value latched into the B input of the multiplier 110 on $\alpha_3$ in process cycle 254.

At this time the A input to the multiplier 110 receives the value $x_n$ from the bus 15 via the A input of the multiplexer 125 which contains the value $x_n$ during the pulse $\alpha_3$ in the process cycle 254. Thus, the input to the multiplier 110 has both terms to form the first update value which is $$h_0 = f(2\mu) \cdot e_n \cdot x_n$$

This value is latched out from the P latch of the multiplier 110 on the pulse $\alpha_3$ in process cycle 255. It will be seen that the multiplier 110 in fact performs both the multiplication functions 55, 61 of FIG. 4. The final stage of normalisation is applied at the multiplier output by selecting 17 bits and this is equivalent to dividing by $t_2$ and truncating. This introduces a noise component $n_h$ (see Equation 6). The data value is checked for overflow and presented to the input of the barrel shifter 129. The barrel shifter has decoded the setting of Q shift and the number of cascade stages $1/c$ from the control bus. The result is latched by latch 130 on the pulse $\alpha_1$ in process cycle 0 and presented to the A input of a 16 bit adder 64. The least significant bit is applied to the carry-in pin to implement rounding. At this time the bus 15 contains $h_a^0$ from the adapt filter which is clocked into a latch 138 on the pulse $\alpha_1$ in process cycle 0 and presented to the B input of the adder 135. The output from the adder is thus the updated value of $h_a^0$ and is checked for overflow before being placed on the bus 14 via a tristate buffer 140 during strobe $\Omega23$ in process cycle 0.

On pulse $\alpha_3$ in process cycle 0 the updated $h_a^0$ is latched into the multiplier 35 of the convolution device 11 to multiplied by $x_{n+1}$ and thereby begin the next convolution process. It is also latched into the adapt register of the memory device 10 so that it can be output as $h_1^0$ old on the bus 15 in the following audio cycle.

It will thus be seen that by stealing a minimum of three process cycles at the end of each audio cycle the algorithm can be implemented without introducing a limit cycle. In the first of these cycles the factor $f(2\mu)$ and the error e are calculated; in the second the product $f(2\mu)\cdot e$ is formed. With some parallel processing the update component for the first value in the impulse response $$h_0 = f(2\mu) \, e \cdot x_{j-1}$$

can be added to $h_0$ in the third process cycle before it is used in the convolution of the following audio cycle. The remaining 13 process cycles of the pause part of the audio cycle shown in FIG. 7 is taken up by data transfers.

$f(2\mu)$ can be enclosed from SSX as follows. From Equation 16 we can write the approximation $$f\left[\frac{2\cdot\mu}{g\cdot k}\right]_{apx} = \frac{C}{\|X\|^2} \approx \frac{C}{2^{trunc(log2\|X\|2)}} \quad (19)$$

To implement this approximation consider Table 1 which shows the truth table of an input-to-output function to solve Equation 19$k$ over an 'n' bit range of $\|X\|^2$. '?' is a don't care condition.

TABLE 1

Truth table for reciprocal approximation.

| | INPUT = $\dfrac{\|X\|^2}{C}$ | | | | | OUTPUT | | | |
|---|---|---|---|---|---|---|---|---|---|
| sign | $2^{m+n}$ | $2^{m+n-1}$ | ... $2^{m-1}$ | $2^m$ | sign | $2^n$ | $2^{n-1}$ | ... $2^1$ | $2^0$ |
| 0 | 1 | ? | ...? | ? | 0 | 0 | 0 | ...0 | 1 |
| 0 | 0 | 1 | ? | ? | 0 | 0 | 0 | 1 | 0 |
| . | | | . | | | | | | . |
| 0 | 0 | 0 | 1 | ? | 0 | 0 | 1 | 0 | 0 |
| 0 | 0 | 0 | 0 | 1 | 0 | 1 | 0 | 0 | 0 |
| 0 | 0 | 0 | ...0 | 0 | 0 | 1 | 1 | ...1 | 1 |

The upper input-value of $2^{n+m+1} - 1$ is set by the expected peak-to-rms ratio of input signal. The lower input-value of $2^{m-1}$ may be set by a hardware constraint; eg a limit on the size of a data transfer between the computation of the sum-of-squares of 'x' (given the abbreviation 'SSX') and the generation of $f(2\mu)$. Consequently these two bounds restrict the range over which compensation, for input level, can be applied.

Figure 9:
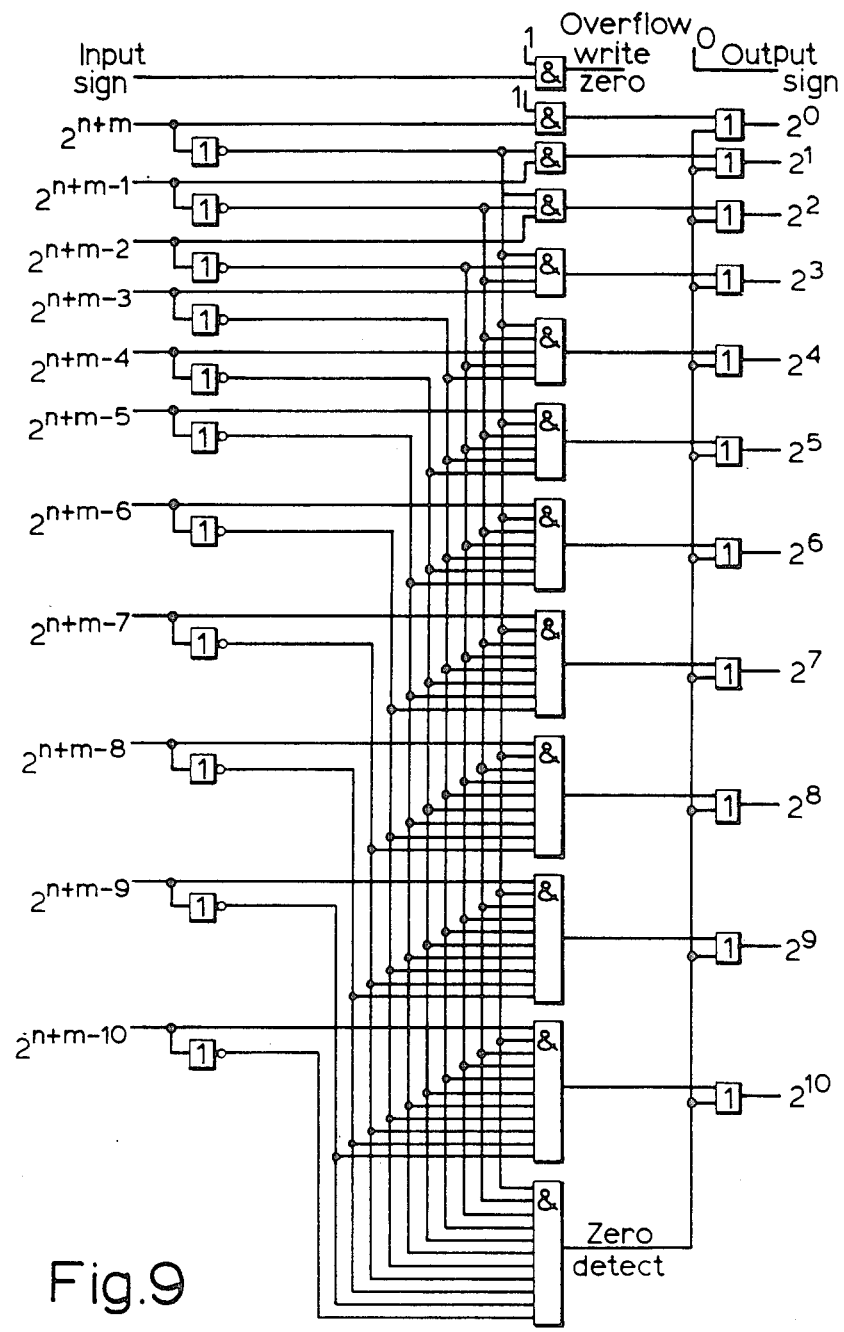
FIG. 9 is a circuit diagram of a circuit for forming $f(2\mu)$.

The simplest method to perform the function require in Table 1 uses combinatorial logic, which is shown in FIG. 9 with 'AND' and 'OR' gates.

Figure 8:
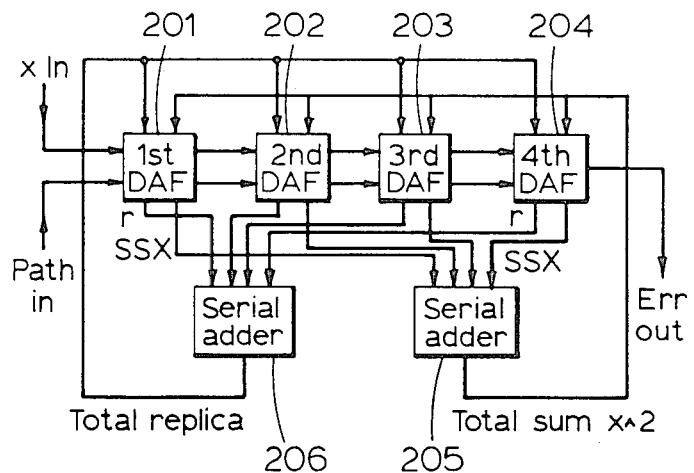
FIG. 8 is a block schematic diagram showing the cascading of filters.

A number of filters can be cascaded to increase the effective number of coefficients. FIG. 8 shows the cascading of four filters 201, 202, 203, 204. In order to cascade filters it is necessary to pass the correct 'x' data to each unit and accumulate externally the partial SSX and replica terms (adders 205, 206 respectively) returning the total values to each filter unit as shown in FIG. 8. Note that the r and SSX lines need to be broken as shown at A and B in FIG. 4.

Audio signals that are input and output from the filter are transferred serially (to reduce the pin count) via pins CASIN and CASOUT, while all internal processing is done with data words in parallel. Therefore, to construct correctly sequenced X and H vectors, it is necessary to extract the appropriate element from the X vector and transfer it to the next section (with parallel-to-serial-to-parallel conversion), plus any data format conversion) so that the sequence of vector elements is unbroken. Assuming that $x_j$ is the newest value in the X vector, then the first value in each filter section is:

| filter section | DAF-1 | DAF-2 | DAF-3 | DAF-4 |
|---|---|---|---|---|
| first X element | $x_j$ | $x_{j-240}$ | $x_{j-480}$ | $x_{j-720}$ |
| first H element | $h^o$ | $h^{240}$ | $h^{480}$ | $h^{720}$ |

Each section will produce partial convolutions and SSX, which must be accumulated externally and the sum transferred back to the appropriate input. The external serial-adders produce a half-process-cycle delay, giving one-process-cycle delay for the quad connection. The partial-replica output from each section comprises 14 bits, 12 bits of data plus 2 sign-extension bits. Thus, by selecting the correctly delayed detection waveform (see DSTBR in FIG. 6(c)), via the control bus, the lower 12-bits of the final value of replica are returned to each filter section. Overflow can be checked by looking for differences the 3 MSBs on the convergence circuit.

The hardware solution is slightly different for SSX. Since the signal x will, in general, be continuous, it can be assumed that the total energy is a quad filter will be 4 times that in a single section. Hence, the final value of SSX can be divided by 4, ie selecting the upper 12 bits from the 14 bit word. The scale factor $1/c$ (the level of cascading) is then corrected on the convergence device. This approach allows for maximum utilization of the 12-bit compensation range (if the above assumption is valid). The delay introduced is one process-cycle per level of cascade (see waveform DSTBX); a half process-cycle for serial addition, the other half to divide by two.

The filter described above has been designed to operate in a loudspeaking telephone application where it needs to rapidly track changes in the modelled reference channel and adapt in the presence of noise.

The filter described above has been designed to operate in a loudspeaking telephone application where it needs to rapidly track changes in the modelled reference channel and adapt in the presence of noise. The input signal is speech having a large peak to mean ratio and a wide spread of talker levels. The range of impulse response lengths require varies from 30 msec to greater than 1000 msec. The filter has features which make it suitable for use in many other applications such as echo control on trunk circuits, equilisation and noise cancellation. Other applications range from adaptive signal processing in biomedical, geophysical and industrial processes, to instrumentation, security systems and active suspension of vehicles.

We claim:

1. An adaptive digital filter comprising means (10) for receiving and storing input samples (x) during recurring sample periods, means (11) for forming, during each sample period from said input samples and filter coefficients, a plurality of convolution products and for accumulating said plurality of products an output signal (r), and means (12) for adjusting said filter coefficients according to a predetermined algorithm, the forming means forming the said convolution products during a first part of each sample period and the adjusting means adjusting said filter coefficients, in response to said convolution products formed during said sample period first part, at least in part during a second part of each sample period which is subsequent to said sample period first part.

2. A digital filter as claimed in claim 1 wherein:
said receiving and storing means includes a memory stage (10) for storing input samples (x) and the filter coefficients (h),
said forming and accumulating means includes an arithmetic stage (11) for forming convolution products of the input samples and the said coefficients and accumulating the products to provide an output signal (r), and
said adjusting means includes means (12) for forming an update signal (h) adapting the filter coefficients according to a predetermined algorithm.

3. A digital filter as claimed in claim 2 wherein said memory stage (10) comprises a first section (30) for storing values of input samples (x), a second section (part of 33) for storing values of filter coefficients (ha) which can be adapted, and a third section (part of 33) for storing values of filter coefficient (hs) which are not adaptable.

4. A digital filter as claimed in claim 3 including means for transferring the contents of the second memory section to the third memory section.

5. A digital filter as claimed in claim 3 or 4 wherein the arithmetic stage includes means (35) for forming a first set of convolution products between values of the input signal (x) and filter coefficients (ha) from the second memory section, means (35) for forming a second set of convolution products between values of the input signal (x) and filter coefficients (hs) from the third memory section, and means (136) for accumulating said first set of convolution products to form a first output signal and for accumulating said second set of convolution products to form a second output signal.

6. A digital filter as claimed in any one of claims 2 to 3 including bus means coupling said stages to permit data transfer between them, and control means (18,20) for providing timing signals to control operation of said stages and transfer of data between said stages.

7. A digital filter as claimed in claim 6 wherein the input samples (x) and coefficient values (h) are multiplexed onto the bus means (14,15) for transfer from the memory stage (10) to the arithmetic stage (11) under the control of clock signals from said control means (18,20).

8. A filter as claimed in any one of claims 2 to 3 wherein:
said adjusting means updates values for the filter coefficients by adding said preset coefficients to a correction factor equal to the product of (a) a scaling factor, (b) an error factor representing the difference between the filter output and a desired signal, and (c) a respective one of the last W input samples, where W is the number of coefficients; and
said forming and accumulating means performs a multiplication operation on the input samples to obtain said convolution products and adds said convolution products to said coefficients during the first part of the sample period, and said adjusting means multiplies the scaling factor by the error factor during the second part of the preceding sample period.

9. A digital filter as claimed in claim 8 wherein said arithmetic stage includes means (41,43) arranged during each sample period to form from sample values x values of $x^2$, accumulated over a predetermined number of samples, which are fed to the third stage (12) for use in forming said update values, and wherein the said predetermined algorithm for updating the filter coefficients H can be expressed as $$H_{new} = H_{old} + f(2\mu) \cdot e \cdot x.$$

where e is an error signal equal to the difference between the filter output (r) and a reference signal (y), x is the input sample and $f(2\mu)$ is a factor derived by decoding in said third stage (12) the said accumulated values of $x^2$.

10. A filter according to claim 9 in which,
   (a) in the second part of the (n−1)th sample period, the scaling factor $f(2\mu)$ is derived from the accumulated value of $x^2$; a new sample (x) is received, and the square of this new value is added to the accumulated value of $x^2$, and the error between the filter output and the derived value is obtained and its product with $f(2\mu)$ obtained,
   (b) in the first part of the nth sample period, a plurality W of process cycles occur in each of which a respective one of the stored sample values $x$, $x_{n-1}$ ... $X_{n-w-1}$ is multiplied by the said product and added to the respective one of the filter coefficients; and the updated value of the coefficient is multiplied by the corresponding one of the stored sample values and accumulated, whereby at the end of the first part of the nth sample period an accumulated filter output is obtained using the error obtained from the immediately preceding coefficient update and
   (c) in the second part of the nth sample period the sample value $x_{n-W}$ is squared and subtracted from the accumulated $x^2$ value.

11. A digital filter as claimed in any one of claims 2 to 3 wherein the step size provided by said third stage can be adjusted.

12. A loudspeaking telephone incorporating a digital filter as claimed in any one of claims 1 to 3.

13. A digital filter which comprises a plurality of filters according to claim 1 arranged in cascade.

14. An adaptive digital filter comprising a memory stage for storing input samples and filter coefficients, an arithmetic stage connected to said memory stage for forming convolution products of said input samples and filter coefficients and for accumulating said products to provide an output signal during a predetermined sampling period, a third stage arranged to form an update signal for adapting said filter coefficients according to a predetermined algorithm substantially during said same predetermined sampling period, bus means coupling said stages to permit data transfer therebetween, and control means for providing timing signals to control operation of said stages and transfer of data between said stages.

15. An adaptive digital filter comprising:
   means for sampling an input signal during recurring sampling periods each including a first portion and a second portion subsequent to said first portion;
   means connected to said sampling means for forming convolution products during said sampling period first portions in response to said sampled input signal and preset filter coefficients, and for generating a filter output signal in response to said convolution products; and
   means connected to said forming means for adjusting said preset filter coefficients during said sampling period second portions,
   said adjusting means adjusting, substantially during the second portion of a given sampling period, said coefficients in response to convolution products formed from input signal samples obtained during the first portion of said same given sampling period, said adjusting means making said adjusted coefficients available at least by the time said first portion of the sampling period immediately succeeding said given sampling period occurs.

16. In an adaptive digital filter of the type which receives and samples a digital input signal, multiplies said input signal samples by filter coefficient values to form convolution products, and accumulates the convolution products to produce a filtered output, an improvement comprising:
   (a) forming convolution products during an initial, burst portion of a first sampling period in response to a digital input signal sample associated with said first sampling period and in response to said filter coefficient values;
   (b) adjusting said filter coefficient values in response to said convolution products formed by said forming step during said first sampling period burst portion substantially during a pause portion of said first sampling period subsequent to said burst portion; and
   (c) forming convolution products during an initial, burst portion of a second sampling period immediately succeeding said first sampling period in response to a digital input signal sample associated with said second sampling period and also in response to said filter coefficient values adjusted by said adjusting step (b).

17. In an adaptive digital filter of the type which receives and samples a digital input signal, multiplies said input signal samples by preset filter coefficient values to form convolution products, and accumulates the convolution products to produce a filtered output, an improvement comprising:
   means for forming convolution products during an initial, burst portion of a first sampling period in response to a digital input signal sample associated with said first sampling period and also in response to said filter coefficient values; and
   means for adjusting said filter coefficient values, in response to said convolution products formed by said forming means, substantially during a pause portion of said first sample period subsequent to said burst portion,
   wherein said forming means also forms convolution products during an initial, burst portion of a second sampling period immediately following said first sampling period in response to a digital input signal sample associated with said second sampling period and also in response to said filter coefficients adjusted by said adjusting means during said first sampling period pause portion.

* * * * *